US006195201B1

(12) United States Patent
Koch et al.

(10) Patent No.: US 6,195,201 B1
(45) Date of Patent: Feb. 27, 2001

(54) REFLECTIVE FLY'S EYE CONDENSER FOR EUV LITHOGRAPHY

(75) Inventors: Donald G. Koch, Burbank; James P. McGuire, Pasadena, both of CA (US); Joseph M. Kunick, Hudson, NH (US)

(73) Assignee: SVG Lithography Systems, Inc., Wilton, CT (US)

( * ) Notice: Subject to any disclaimer, the term of this patent is extended or adjusted under 35 U.S.C. 154(b) by 0 days.

(21) Appl. No.: 09/238,976

(22) Filed: Jan. 27, 1999

(51) Int. Cl.$^7$ ................................................. G02B 17/00
(52) U.S. Cl. .................... 359/366; 359/859; 359/861; 359/851; 359/853; 355/67; 378/35
(58) Field of Search .......................... 359/350–359, 359/365, 366, 434, 727, 730, 731, 858, 859, 861, 851, 853, 627, 900, 428; 355/45, 49, 67, 57, 60, 65, 66; 378/34, 35

(56) References Cited

U.S. PATENT DOCUMENTS

| 5,339,346 | 8/1994 | White ........................................ 378/34 |
| 5,361,292 | 11/1994 | Sweatt ...................................... 378/34 |
| 5,512,759 | 4/1996 | Sweatt ...................................... 250/492.1 |
| 5,581,605 | * 12/1996 | Murakami et al. ...................... 378/34 |
| 5,631,721 | 5/1997 | Stanton et al. ........................... 355/71 |
| 5,677,939 | 10/1997 | Oshino ..................................... 378/34 |
| 5,815,310 | 9/1998 | Williamson ............................. 359/365 |

FOREIGN PATENT DOCUMENTS 0 939 341 A2  9/1999  (EP).
0 955 641 A1  11/1999  (EP).

OTHER PUBLICATIONS

Jenkins and Winston, Tailored Reflectors for Illuminators, Apr. 1, 1996, Applied Optics vol. 35, No. 10, pp. 1669–1671.

O. Kusch, Computer–Aided Optical Design Of Illuminating and Irrdiating Devices, 1993, Chapter 3, pp. 145–173.

Schruben, Formulation of a Reflector–Design Problem for a Lighting Fixture, Dec. 1972, Journal of the Optical Society of America, vol. 62, No. 12, pp. 1498–1501.

* cited by examiner

Primary Examiner—Darren Schuberg
Assistant Examiner—Fayez Assaf
(74) Attorney, Agent, or Firm—Fattibene & Fattibene; Paul A. Fattibene; Arthur T. Fattibene

(57) ABSTRACT

An illumination source or condenser used to project the image of a reticle onto a photosensitive substrate used in photolithography having a first reflective fly's eye, faceted mirror, or mirror array with predeterminedly positioned facets or elements and a second reflective fly's eye, faceted mirror, or mirror array having predeterminedly positioned facets or elements for creating a desired radiant intensity, pupil fill, or angular distribution. A source of extreme ultraviolet electromagnetic radiation is provided to a first fly's eye or mirror array with arcuate shaped facets or elements. The arcuate shaped facets or elements are positioned to create an image of the source at corresponding facet in a second reflective fly's eye or mirror array. A desired shape and irradiance together with a desired radiant intensity, pupil fill, or angular distribution is obtained. An arcuate illumination field or image is formed with high efficiency in a compact package. The illumination system of the present invention facilitates imaging of feature sizes as small as 0.025 microns, utilizing electromagnetic radiation in the extreme ultraviolet and ranging from 1 nanometer to approximately 157 nanometers.

58 Claims, 15 Drawing Sheets

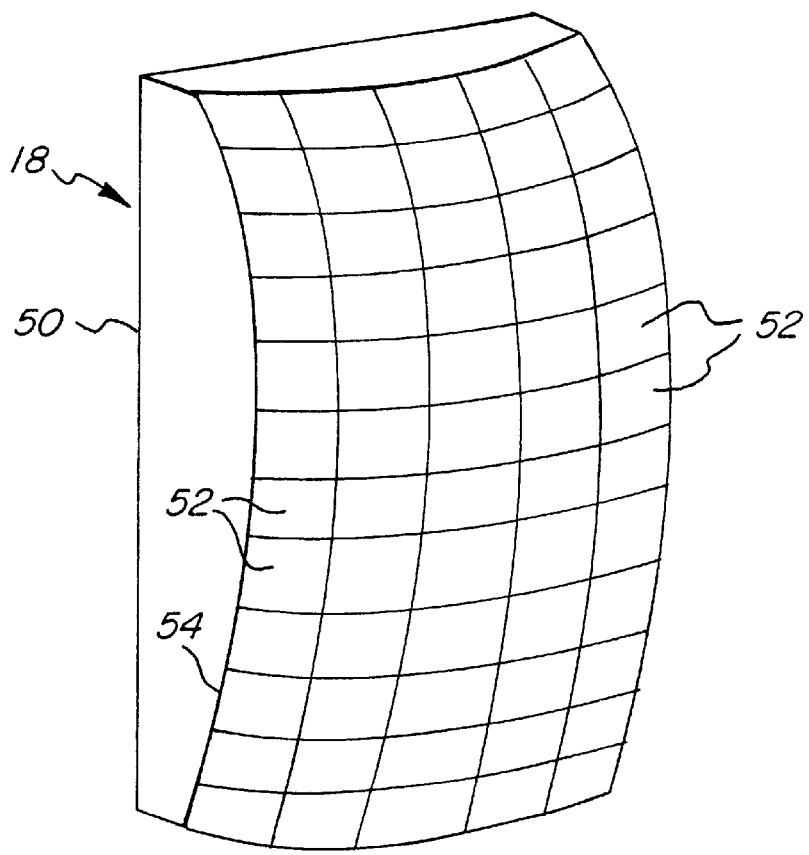
*FIG. 4A*
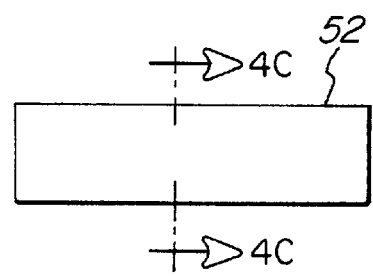 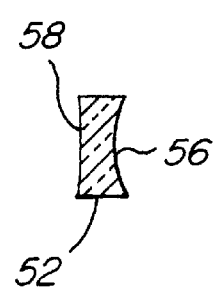
*FIG. 4B* *FIG. 4C*

REFLECTIVE FLY'S EYE CONDENSER FOR EUV LITHOGRAPHY

FIELD OF THE INVENTION

The present invention relates generally to a condenser and illumination systems for projecting the image of a reticle onto a photosensitive substrate as used in photolithography in semiconductor manufacturing, and more particularly to a condenser suitable for use in the extreme ultraviolet or soft X-ray wavelengths having reflective fly's eyes, faceted mirror, or mirror arrays for forming a desired irradiance and desired angular distribution, pupil fill, or radiant intensity.

BACKGROUND OF THE INVENTION

Photolithography is often used in the manufacture of many devices and in particular, electronic or semiconductor devices. In a photolithographic process, the image of a reticle or mask is projected onto a photosensitive substrate. As the element or feature size desired to be imaged on the photosensitive substrate becomes ever smaller, technical problems often arise. One of these problems is illuminating the reticle or mask so that its image can be projected onto the photosensitive substrate. As the element or feature size of semiconductor devices become ever smaller, there is a need for photolithographic systems providing a resolution of less than 0.13 micrometers. In order to achieve the imaging of these relatively small element or feature sizes, shorter wavelengths of electromagnetic radiation must be used to project the image of a reticle or mask onto the photosensitive substrate. Accordingly, it is often necessary for photolithographic systems to operate at the extreme ultraviolet wavelengths, below 157 nanometers, and into the soft X-ray wavelengths, around 1 nanometers. Additionally, projection optics having the required resolution and imaging capabilities often result in utilization of a portion of a ring field. One such projection optic system used in photolithography is disclosed in U.S. Pat. No. 5,815,310 entitled "High Numerical Aperture Ring Field Optical Reduction System" issuing to Williamson on Sep. 29, 1998, which is herein incorporated by reference in its entirety. While the projection optic system disclosed therein can achieve a working resolution of 0.03 microns, there are few illumination sources or illumination systems that can provide the required illumination properties for projecting the image of the reticle or mask onto the photosensitive substrate. An illuminating system is disclosed in U.S. Pat. No. 5,339,346 entitled "Device Fabrication Entailing Plasma-Derived X-Ray Delineation" issuing to White on Aug. 16, 1994. Therein disclosed is a condenser for use with a laser-pumped plasma source having a faceted collector lens including paired facets, symmetrically placed about an axis. Another illumination system is disclosed in U.S. Pat. No. 5,677,939 entitled "Illuminating Apparatus" issuing to Oshino on Oct. 14, 1997. Therein disclosed is an illumination system for illuminating an object in an arcuate pattern having a reflecting mirror with a parabolic-toric body of rotation and a reflection type optical integrator having a reflecting surface for effecting the critical illumination in the meridoinal direction and a reflecting surface for effecting the Kohler illumination in the sagittal direction. Another illuminating system is disclosed in U.S. Pat. No. 5,512,759 entitled "Condenser For Illuminating A Ring Field Camera With Synchrotron Emission Light" issuing to Sweatt on Apr. 30, 1996, which is herein incorporated by reference in its entirety. Therein disclosed is a condenser comprising concave and convex spherical mirrors that collect the light beams, flat mirrors that converge and direct the light beams into a real entrance pupil of a camera, and a spherical mirror for imaging the real entrance pupil through the resistive mask and into the virtual entrance pupil of the camera. Another illumination system is disclosed in U.S. Pat. No. 5,361,292 entitled "Condenser For Illuminating A Ring Field" issuing to Sweatt on Nov. 1, 1994. Therein disclosed is a condenser using a segmented aspheric mirror to collect radiation and produce a set of arcuate foci that are then translated and rotated by other mirrors so that all the arcuate regions are superposed at the mask. Another illumination system is disclosed in U.S. Pat. No. 5,631,721 entitled "Hybrid Illumination System For Use in Photolithography" issuing to Stanton et al on May 20, 1997, which is herein incorporated by reference in its entirety. Therein disclosed is a multi-image optical element, a condenser, and an array or diffractive optical element.

However, these prior illumination systems may not provide the desired illumination and are relatively complicated. Additionally, many of these systems are relatively large, having many surfaces resulting in loss of energy. Some are also difficult to align and may require adjustment.

Accordingly, there is a need for an improved illumination system and condenser for use in the extreme ultraviolet that provides a desired irradiance over a predetermined field or area with a desired irradiance and angular distribution, pupil fill, or radiant intensity for use in photolithography.

SUMMARY OF THE INVENTION

The present invention is directed to an illumination system and particularly a condenser for use in the extreme ultraviolet spectrum that provides a desired illumination. A reflector collects electromagnetic radiation from a source and directs it to a first reflective fly's eye, faceted mirror, or mirror array. The first reflective fly's eye or mirror array has elements or facets preferably having an arcuate shape. The first reflective fly's eye or mirror array has a plurality of individual elements or facets having surface deviations on top of a base surface resulting in a desired irradiance and desired angular distribution, pupil fill, or radiant intensity at a second reflective fly's eye, faceted mirror, or mirror array. The second reflective fly's eye or mirror array is positioned to receive the electromagnetic radiation from the first reflective fly's eye or mirror array. The desired radiant intensity having a desired shape is relayed to a reticle for projection onto a photosensitive substrate.

Accordingly, it is an object of the present invention to provide a desired illumination to a reticle for projection onto a photosensitive substrate.

It is an advantage of the present invention that an arcuate shaped illumination field is formed.

It is a further advantage of the present invention that a desired irradiance and desired radiant intensity or pupil fill is obtained.

It is yet a further advantage of the present invention that uniformity may be adjusted by varying the number of facets and adjusting the size of illumination received.

It is yet a further advantage that radiant intensity at the illumination field may be modified by varying the correlation between facets or the size, shape, and position of facets.

It is a feature of the present invention that a generally concave first reflective fly's eye or mirror array having arcuate facets is imaged by a second reflective fly's eye or mirror array.

It is a further feature of the present invention that a generally convex second reflective fly's eye or mirror array having facets with each facet having a surface deviation forms a desired irradiance and desired radiant intensity at an illumination field.

It is yet a further feature of the present invention that the power of the facets may be modified to obtain the desired illumination field.

These and other objects, advantages, and features will become readily apparent in view of the following detailed description.

BRIEF DESCRIPTION OF THE DRAWINGS

FIG. 4A is a perspective view illustrating the second reflective fly's eye, faceted mirror, or mirror array.

FIG. 4B is an elevational view illustrating the rectangular shape of a single element or facet.

FIG. 4C is a cross section taken along line 4C—4C in FIG. 4B.

DETAILED DESCRIPTION OF THE PREFERRED EMBODIMENTS

Figure 1:
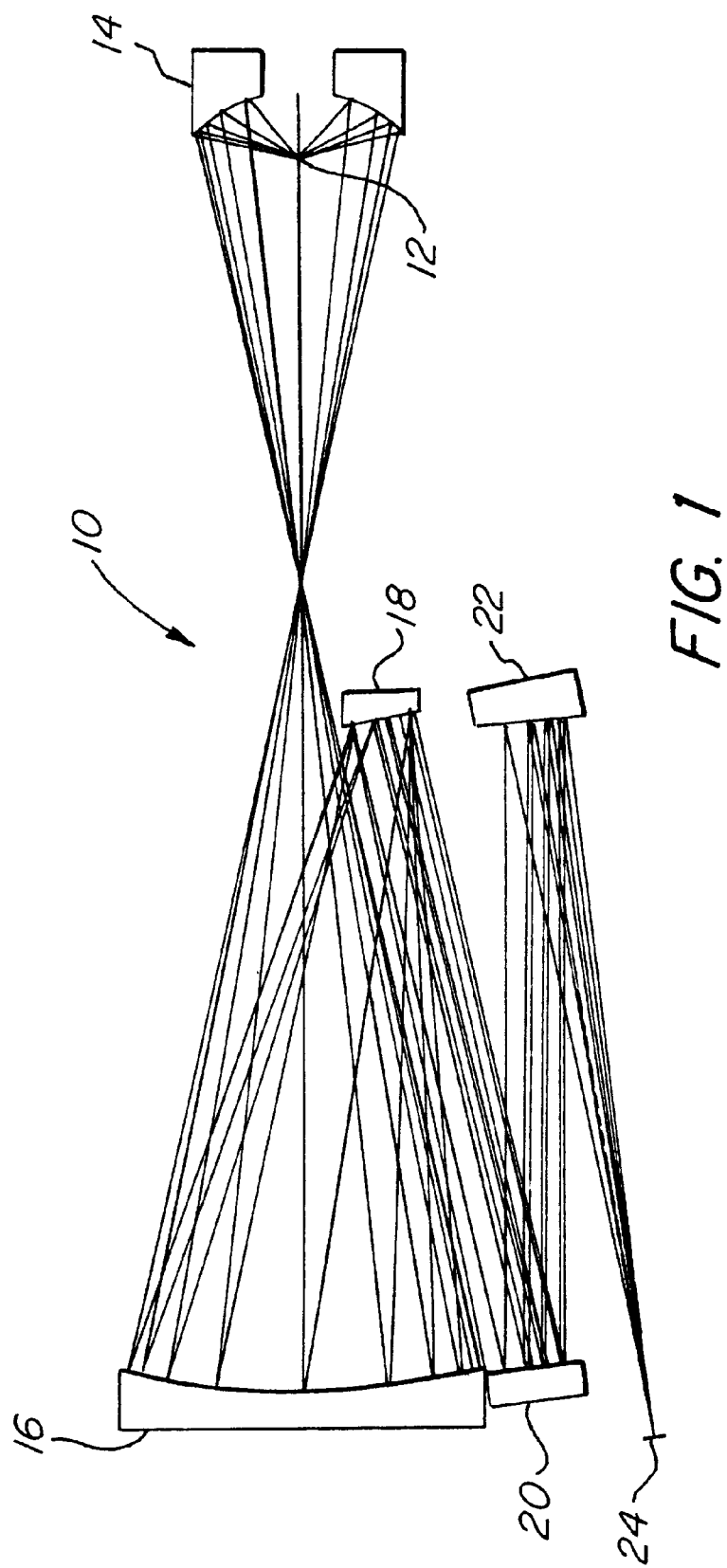
FIG. 1 is a schematic illustration of an illumination system of the present invention.

FIG. 1 schematically illustrates the illumination system or condenser of the present invention. Condenser 10 uses a source 12, which may be an extreme ultraviolet or EUV source, such as a laser plasma source, a capillary discharge tube, or a synchrotron. The electromagnetic radiation from the source 12 is collected by reflector 14. Reflector 14 preferably has an elliptical shape to provide an intermediate image for a spectral filter and/or contamination control window. A hyperbolic shape could also be used. However, for a synchrotron source, the reflector 14 maybe of another form well known to those skilled in the art. Reference Lopez-Delgado and Swarc, Optical Cimmunications, Vol. 19 #2, pages 286–291, 1976. In some applications, the collector could be eliminated entirely. The electromagnetic radiation reflected from reflector 14 is collected by a reflective fly's eye or first mirror array 16. The terms reflective fly's eye or mirror array are intended to include or also refer to a faceted mirror. Electromagnetic radiation reflected from the first reflective fly's eye or mirror array 16 is collected by a second reflective fly's eye or second mirror array 18. The first reflective fly's eye or mirror array 16 has a plurality of reflective elements or mirrors that are used to form a plurality of source images near the corresponding facets in the second reflective fly's eye or second mirror array 18. Electromagnetic radiation reflected from the second reflective fly's eye or mirror array 18 is relayed by a first reflective optical element 20 and a second reflective optical element 22 to an image plane or illumination field 24. The combination of the optical elements 20 and 22 relays the image of an aperture stop, located near the second reflective fly's eye 18, into the pupil of a projection optic. The first and second optical elements 20 and 22 are coma corrected to preserve the uniform angular distribution for all points across the illumination field 24. The combination of the relay formed by the first optical element 20 and second optical element 22 and each element or facet of the second reflective fly's eye or mirror array 18 overlaps the images of the apertures of the corresponding element in the first reflective fly's eye or mirror array 16 at the illumination field or plane 24. Preferably, the illumination field 24 is an arcuate area,and at least the first reflective fly's eye 16 has elements or facets with an arcuate aperture similar in shape to the arcuate area forming the illumination field 24. This provides more efficient illumination.

Figure 2:
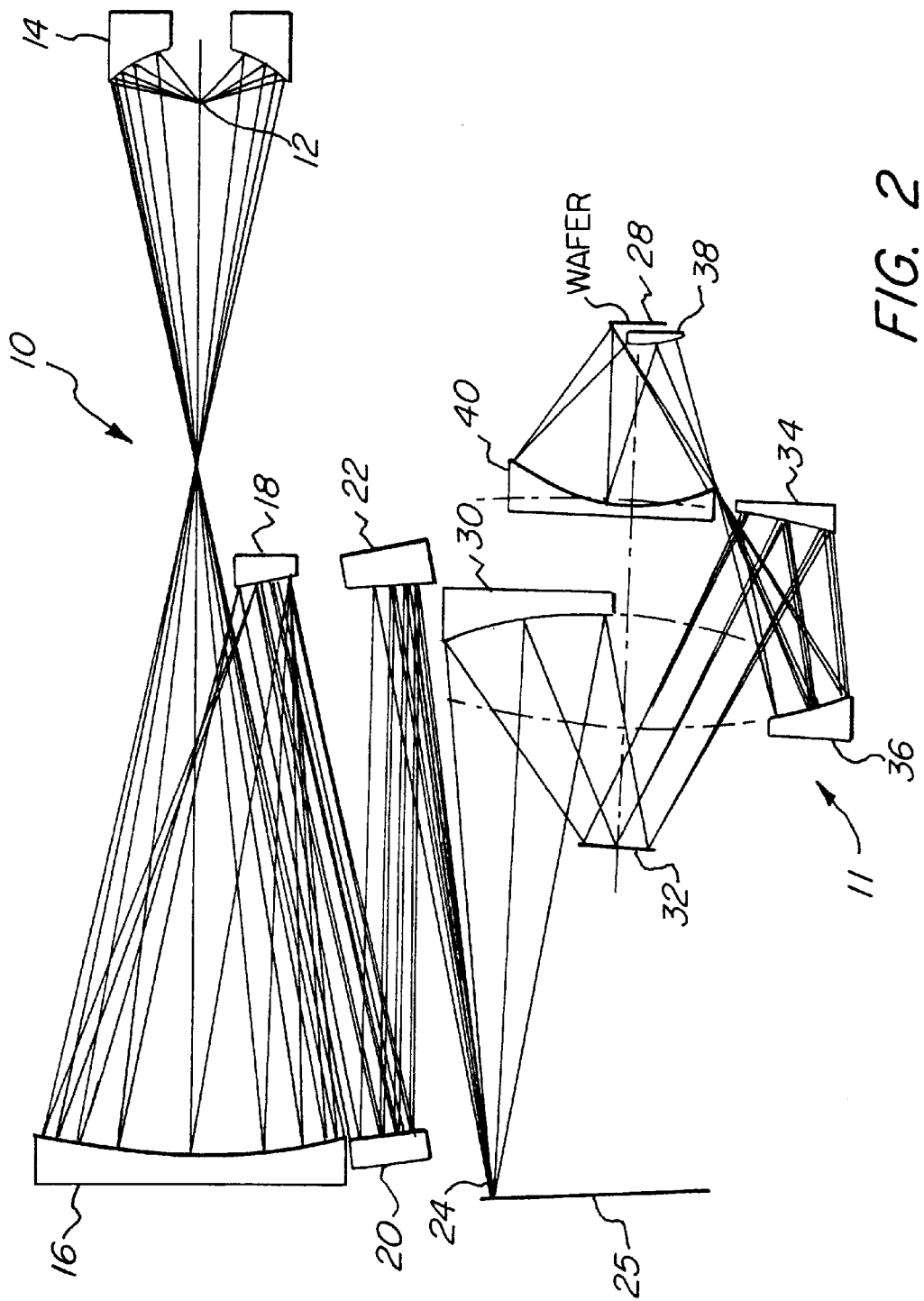
FIG. 2 is a schematic illustration showing the illumination system of the present invention in combination with projection optics.

FIG. 2 schematically illustrates the illumination system or condenser 10 of the present invention used in combination with projection optics 11. The projection optics 11 may be any projection optics, but preferably is a reduction projection optic such as that disclosed in U.S. Pat. No. 5,815,310 entitled "High Numerical Aperture Ring Field Optical Reduction System" issuing to Williamson on Sep. 29, 1998, which is herein incorporated by reference. The illumination system or condenser 10 forms an illumination field 24 having a predetermined shape, preferably arcuate shape, with a desired irradiance and desired angular distribution, pupil fill, or radiant intensity. However, any predetermined or desired irradiance and radiant intensity may be formed. The arcuate illumination field 24 illuminates a reticle 25 containing an image to be reproduced onto a photosensitive substrate 28. Electromagnetic radiation reflected from the reticle 25 is received by first mirror 30 and reflected to a second mirror 32, which in turn reflects it to the third mirror 34, which in turn reflects it to fourth mirror 36, which in turn reflects it to fifth mirror 38, which in turn reflects it to sixth mirror 40, which reflects the electromagnetic radiation forming an image of the reticle 25 on the photosensitive substrate 28. Preferably, the projection optic 11 has a magnification less than one so that the image of the reticle 25 is reduced at the photosensitive substrate 28.

Figure 3A:
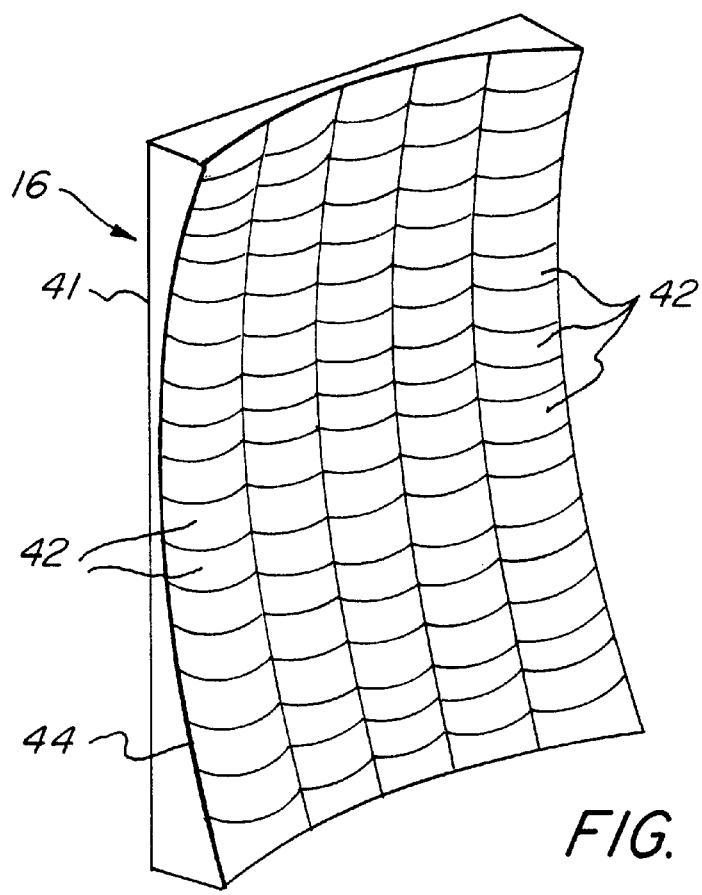
FIG. 3A is a perspective view illustrating a first reflective fly's eye, faceted mirror, or mirror array of the present invention.
Figure 3B:
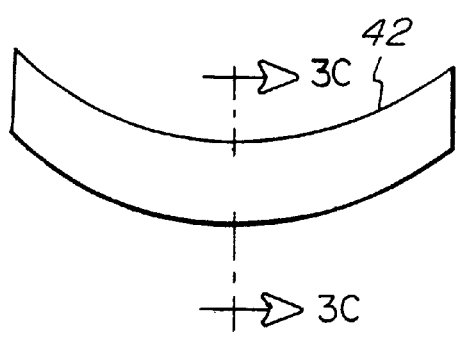
FIG. 3B is an elevational view illustrating the arcuate shape of a single element or facet.
Figure 3C:
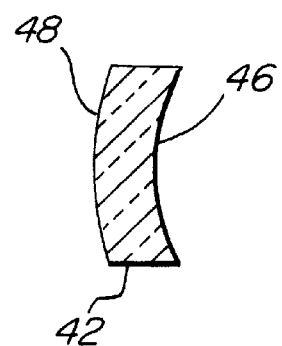
FIG. 3C is a cross section taken along line 3C—3C in FIG. 3B.

FIGS. 3A–C more fully illustrate the first reflective fly's eye, faceted mirror, or mirror array 16 illustrated in FIGS. 1 and 2. FIG. 3A is a perspective view illustrating a reflective fly's eye or mirror array 16. The first reflective fly's eye or mirror array 16 has a base 41. Base 41 has a concave base surface 44. Mounted on the concave base surface 44 are a plurality of reflective facets or elements 42. Facets 42 are arcuate in shape and have a concave surface. The concave base surface 44 may be spherical to simplify fabrication, but more complicated shapes such as anamorphic aspheres may be desirable to result in higher throughput. FIG. 3A illustrates the first reflective fly's eye or mirror array 16 being divided into a plurality of rows and columns. While any number of rows and columns may be suitable, a six by eighty-three array has been determined to be preferred. Generally, the specific dimensions provided for in the preferred embodiment are designed for a projection optical reduction system such as that disclosed in U.S. Pat. No. 5,815,310. However, the present invention may be adapted to other specific dimensions depending upon the application. Improvements in uniformity may be achieved by increasing the array size. The surface of the first reflective fly's eye or mirror array 16 is engineered to fill the corresponding facet in the second reflective fly's eye or mirror array, illustrated in FIGS. 1 and 2, with an image of the source. The positioning or axial displacement of the reflective fly's eyes may be accomplished by pistons contacting the elements or facets forming the reflective fly's eyes, or other equivalent means. Additionally, the magnification or surface shape of each of the facets or elements may be modified to eliminate the need for the pistons or to physically displace the facets or elements. Each element or facet 42 of the first reflective fly's eye or mirror array 16 receives electromagnetic radiation from the source and fills the corresponding facet or element of the second reflective fly's eye or mirror array. FIG. 3B is a plan view illustrating the arcuate shape of a single facet or element 42 forming the first reflective fly's eye or mirror array 16. The facet or element 42 preferably has dimensions of approximately seven by ninety-three millimeters, in the preferred embodiment. FIG. 3C is a cross section taken along line 3C—3C in FIG. 3B. Facet or element 42 has a reflective concave surface 46 and a convex surface 48. Convex surface 48 may approximately match the concave base surface 44. However, the surface 48 may also be flat or planar, or any other suitable shape. The concave facet or element 42 may have a concave reflective surface 46 with a radius between approximately 1,100 to 1,300 millimeters. The facet or element 42 is mounted onto the base surface 44, illustrated in FIG. 3A, such that it can be displaced from the surface and angularly tilted.

FIGS. 4A–C more fully illustrate the structure of the second reflective fly's eye, faceted mirror, or mirror array 18 illustrated in FIGS. 1 and 2. FIG. 4A is a perspective view generally illustrating the second reflective fly's eye or mirror array 18. A convex base 50, which may have a convex base surface having a radius of approximately 800 millimeters, has a plurality of rectangular reflective concave facets 52 mounted thereon. The reflective concave facets or elements 52 are mounted in an array formed of columns and rows. While the facets or elements 52 of the second reflective fly's eye or mirror array 18 are preferably rectangular for ease of manufacturing, other shapes may be desired for different applications, such as square. Preferably, the facets or elements 52 have dimensions of approximately five by five millimeters. The concave facets or elements 52 may have a radius of approximately 2100 millimeters. The number of facets or elements 52 may correspond one to one to the number of facets or elements 42, illustrated in FIG. 3A, of the first reflective fly's eye or mirror array 16 or the second reflective fly's eye or mirror array 18 may have more or less facets or elements 52 arranged in a matrix or grid pattern. FIG. 4B is a plan view illustrating a possible rectangular shape of the facet or element 52. FIG. 4C is a cross section taken along line 4C—4C in FIG. 4B. FIG. 4B illustrates facet or element 52 having a reflective concave facet surface 56 and a concave surface 58. The concave surface 58 may approximately match the convex surface 54 of the base 50, illustrated in FIG. 4A, or may be flat or planar, or any other suitable shape. Facet 52 may be mounted on the base 50, illustrated in FIG. 4A, so that it can be displaced a predetermined distance from the surface and tilted or angled in a predetermined way.

Figure 5A:
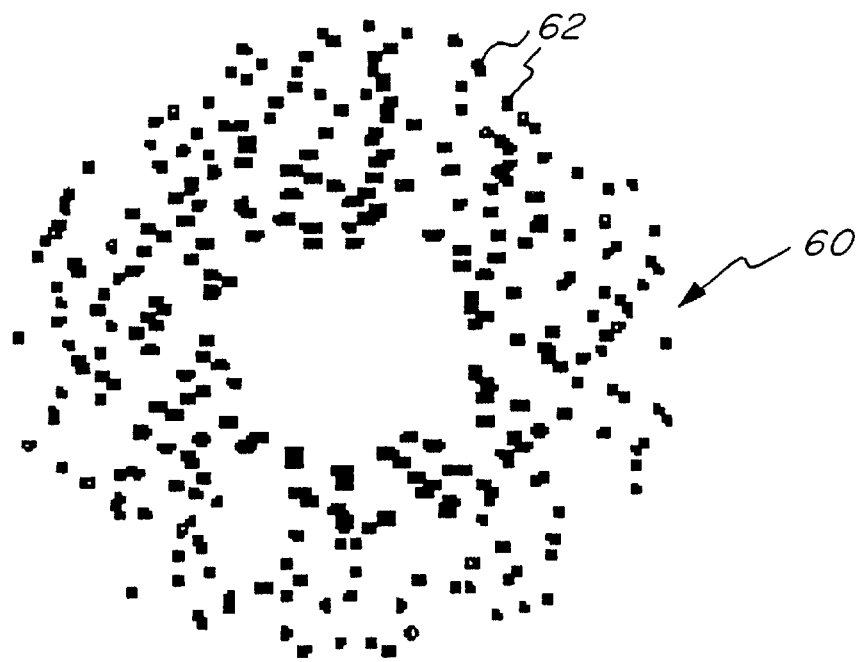
FIG. 5A is a plan view illustrating an annular illumination pupil fill.
Figure 5B:
FIG. 5B is a graph illustrating the irradiance profile of an annular illumination pattern.

FIGS. 5A–B illustrates the irradiance and angular distribution, pupil fill, or radiant intensity for a reflective fly's eye having generally random positioned source images on the facets of the second reflective fly's eye or mirror array. However, the reflective fly's eye is oriented to provide a generally annular angular distribution, pupil fill, or radiant intensity. The angular distribution, pupil fill, or radiant intensity of electromagnetic radiation may be in the form of a top hat illumination, uniform illumination, quadruple illumination, or other known illumination. Accordingly, when looking back towards the source at any single point on the reticle, the predetermined or desired angular distribution, pupil fill, or radiant intensity is seen. By summing or adding all of the individual source images, an overall or uniform desired irradiance at the illumination field or image plane is obtained. The desired irradiance is substantially uniform in the preferred embodiment. FIG. 5A illustrates the generally annular pupil fill 60 that is composed of a plurality of generally randomly positioned images or illumination pixels 62. FIG. 5B illustrates the desired illumination pattern. A cross section taken along a diameter of the illumination pattern illustrated in FIG. 5A approximates the desired pattern shown in FIG. 5B. Waveform 64 illustrates the illumination intensity having a desired annular form. The greater the uniformity of the illumination pixels 62, and the greater number of pixels 62, the better the approximation to the desired illumination pattern will be. The image grid is preferably square or hexagonal on the second reflective fly's eye or mirror array to provide approximately the same number of source images along the X and Y axis. Without this symmetry, the condenser would introduce biases between the line widths or features oriented at zero degrees and ninety degrees.

Figure 6A:
FIG. 6A is a plan view illustrating an arcuate illumination field.
Figure 6B:
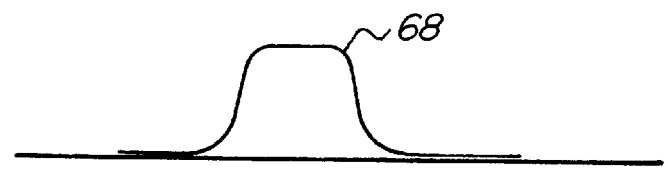
FIG. 6B is a graph illustrating the irradiance profile of a lateral section taken along line 6B—6B of the illumination field illustrated in FIG. 6A.
Figure 6C:
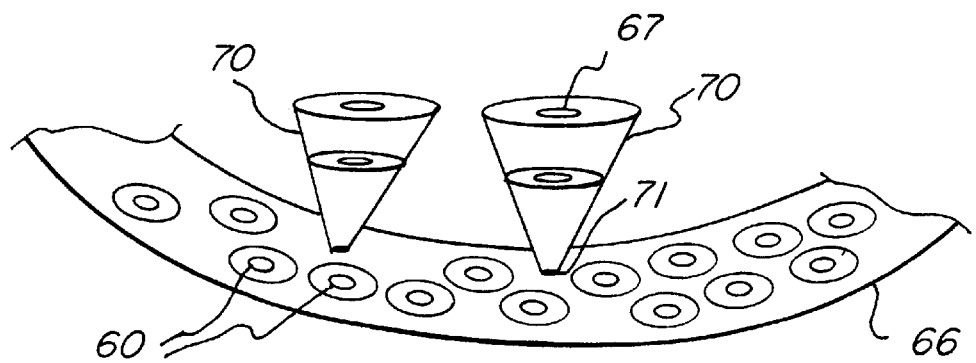
FIG. 6C is a schematic perspective view illustrating a portion of the illumination field.

FIGS. 6A–C illustrate the formation of an arcuate illumination field or image plane 66. FIG. 6A is a plan view illustrating a desired arcuate shape for the illumination field or image plane 66. FIG. 6B represents the irradiance for a lateral cross section of the arcuate illumination field or image plane 66, illustrated in FIG. 6A. Waveform 68 illustrates the desired irradiance being substantial uniform across the width of the arcuate illumination field 66, illustrated in FIG. 6A. Irradiance longitudinally along the arcuate field 66 is also preferably substantially uniform and can be adjusted by changing the size of the illuminated region on the first fly's eye or mirror array. FIG. 6C illustrates a portion of the arcuate illumination field 66, illustrated in FIG. 6A. The substantially uniform irradiance or illumination is formed and graphically illustrated by a plurality of annular angular distributions, radiant intensities, or pupil fills 60. A cone of illumination 70 provides electromagnetic radiation having a desired angular distribution, pupil fill, or radiant intensity forming the arcuate illumination field 66. The angular extent of the cone of illumination 70 may be controlled by the illumination system of the present invention. It should be appreciated that at the illumination field 66 the cone of illumination comes to a focus 71, and that the central obscuration occurs only when moving away from the focus 71. Accordingly, a desired irradiance and radiant intensity may be achieved. Preferably, a uniform irradiance is used.

Figure 7:
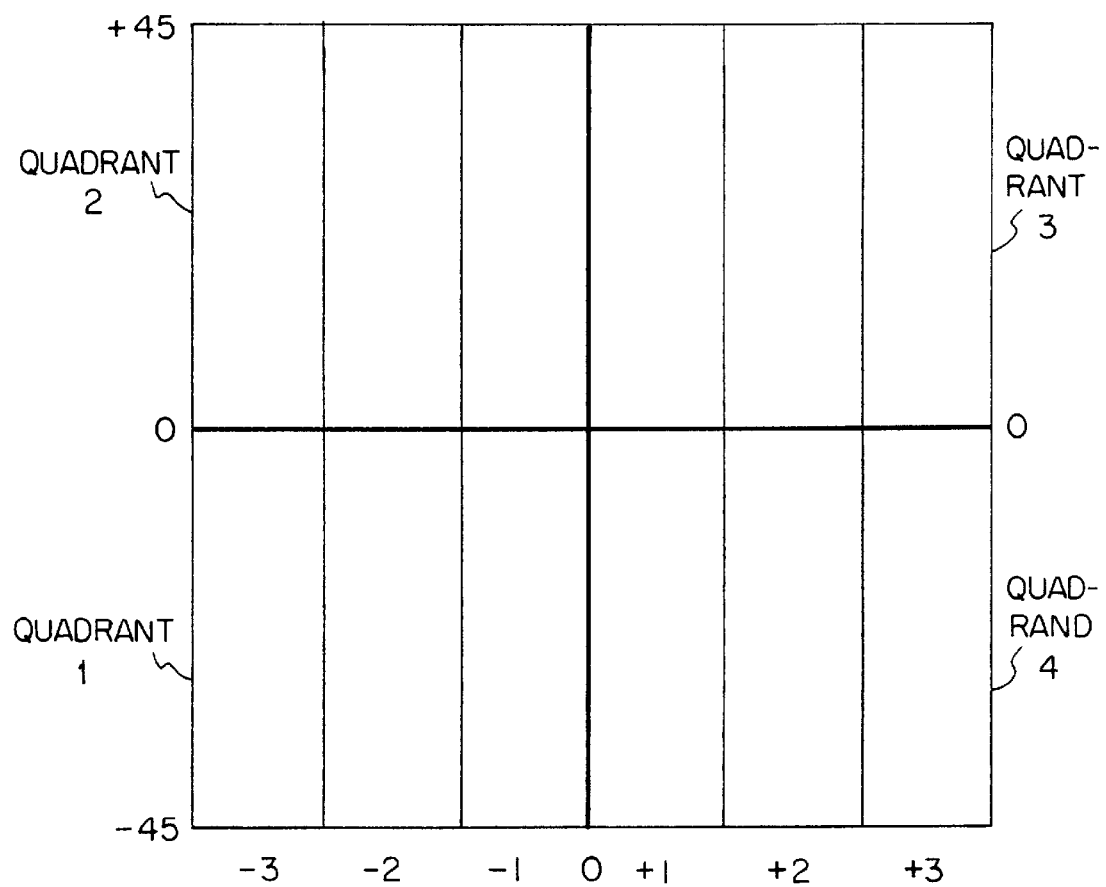
FIG. 7 is a graphic illustration of the coordinate convention utilized in describing element or facet placement in the first and second reflective fly's eyes or mirror arrays.

FIG. 7 graphically illustrates a coordinate system convention used in describing the positioning of the reflective facets or elements on the first and second reflective fly's eyes and mirror arrays used in the present invention. Each reflective fly's eye or mirror array may be divided into four quadrants, quadrant 1, quadrant 2, quadrant 3, and quadrant 4. Associated with each quadrant are a plurality of columns, illustrated as columns −3 to +3 in FIG. 7. However, a different number of columns may be utilized depending upon the application and desired irradiance and radiant intensity. Additionally, associated with each quadrant is a plurality of rows, which have not individually been identified but range approximately from row −45 to row +45. Accordingly, FIG. 7 illustrates a coordinate system convention having six columns and ninety rows forming a six by ninety array.

Figure 8A:
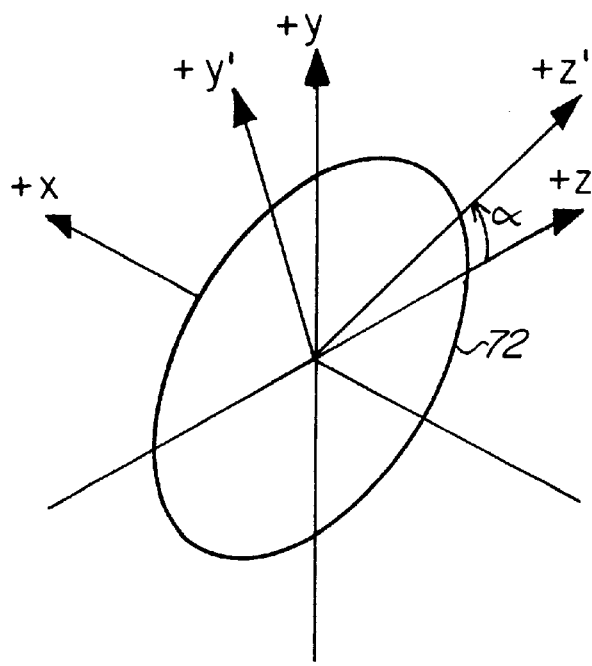
FIG. 8A graphically illustrates the alpha tilt angle surface deviations of an element or facet in the first and second reflective fly's eyes or mirror arrays.
Figure 8B:
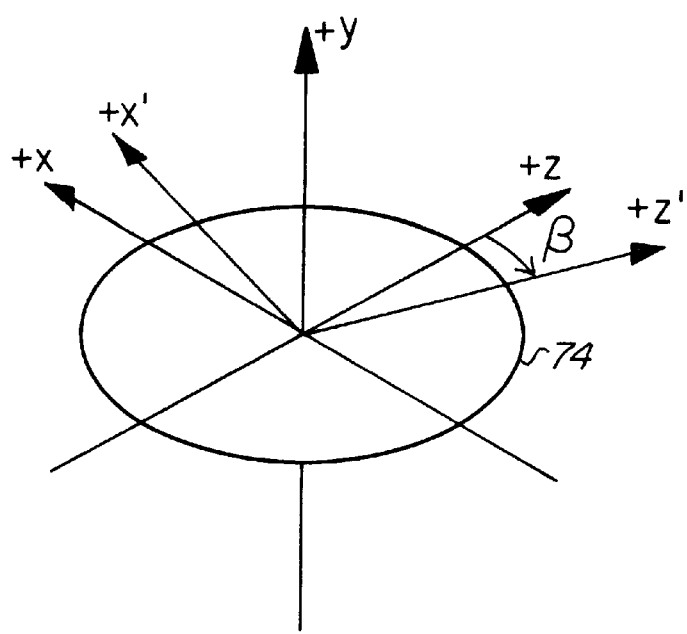
FIG. 8B graphically illustrates the beta tilt angle surface deviations of an element or facet in the first and second reflective fly's eyes or mirror arrays.

FIGS. 8A–B graphically illustrates the positioning of a facet or element forming the reflective fly's eye or mirror arrays of the present invention. FIGS. 8A–B graphically represents the tilting of a facet or element used in either the first or second reflective fly's eye or mirror array illustrated in the prior figures. In FIG. 8A, circle 72 represents the alpha($\alpha$) angle tilt. The alpha angle tilt is in the Y-Z plane, rotated about the X axis. In FIG. 8B, circle 74 represents the beta($\beta$) angel tilt. The beta angle tilt is in the X-Z plane, rotated about the Y axis. The positioning and locating of a facet can be defined by reference to an alpha ($\alpha$) tilt angle and a beta ($\beta$) tilt angle in combination with a Z displacement.

FIGS. 9A–C and 10A–C graphically illustrate the positioning of the individual facets or elements for the first and second reflective fly's eyes and mirror arrays utilizing the coordinate system convention illustrated in FIGS. 7 and 8. While the graphs in FIGS. 9A–C and 10A–C primarily refer to quadrants 1 and 2, quadrants 3 and 4 may be considered to be mirror images or complementary and can easily be determined based on the information contained in FIGS. 9A–C and 10A–C.

Figure 9A:
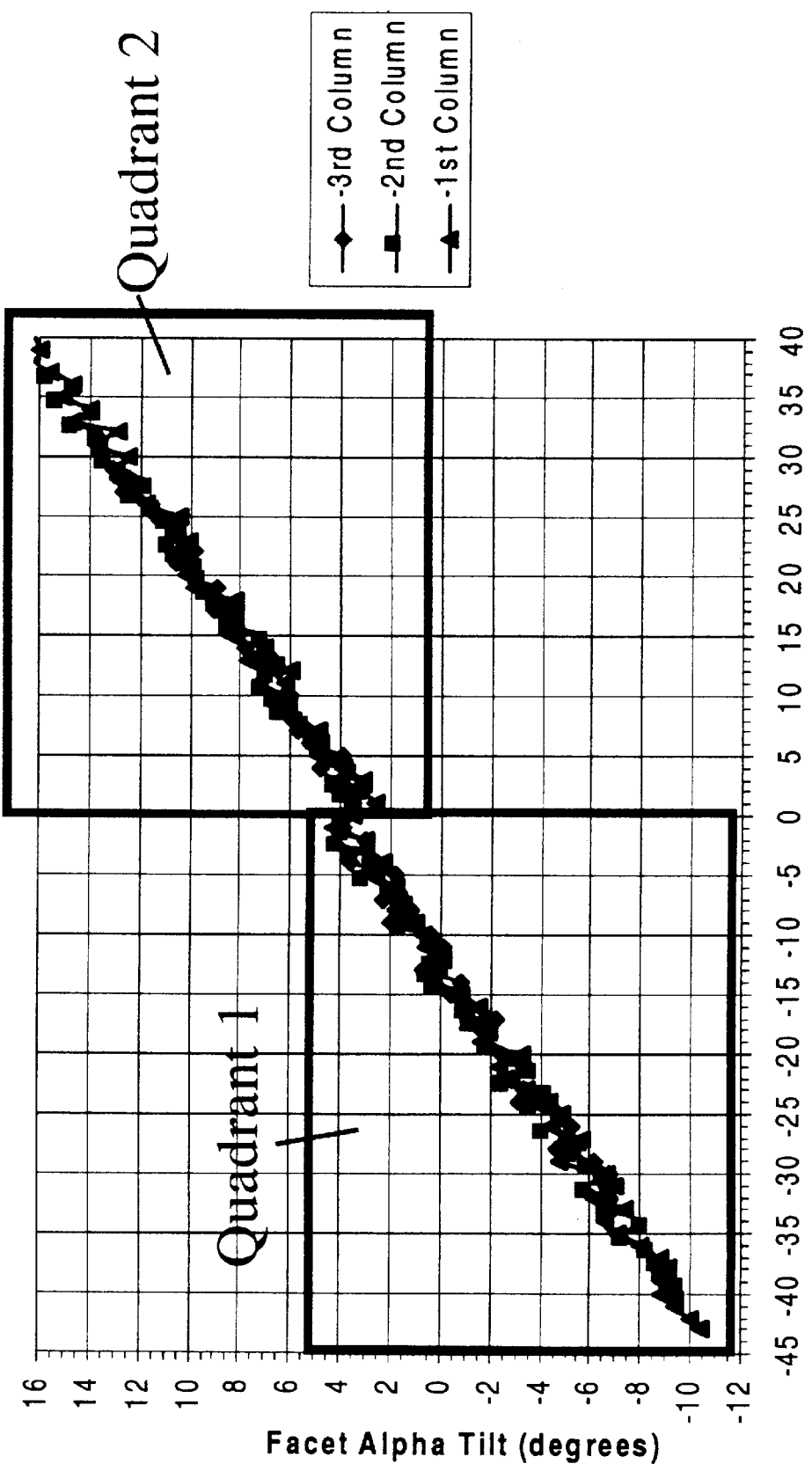
FIG. 9A graphically illustrates the alpha tilt of each facet or element in the first reflective fly's eye or mirror array.
Figure 9B:
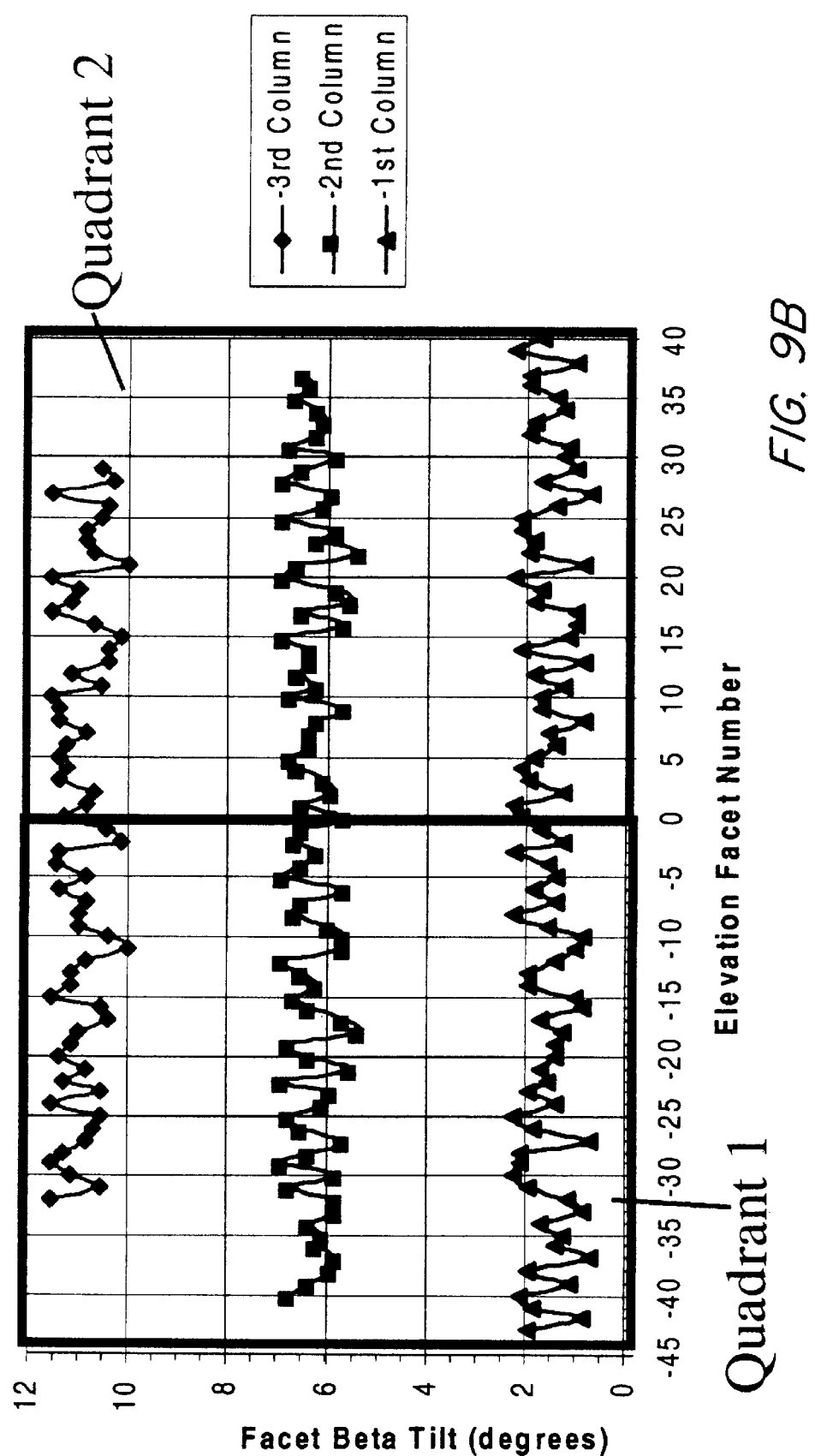
FIG. 9B graphically illustrates the beta tilt of each element or facet in the first reflective fly's eye or mirror array.
Figure 9C:
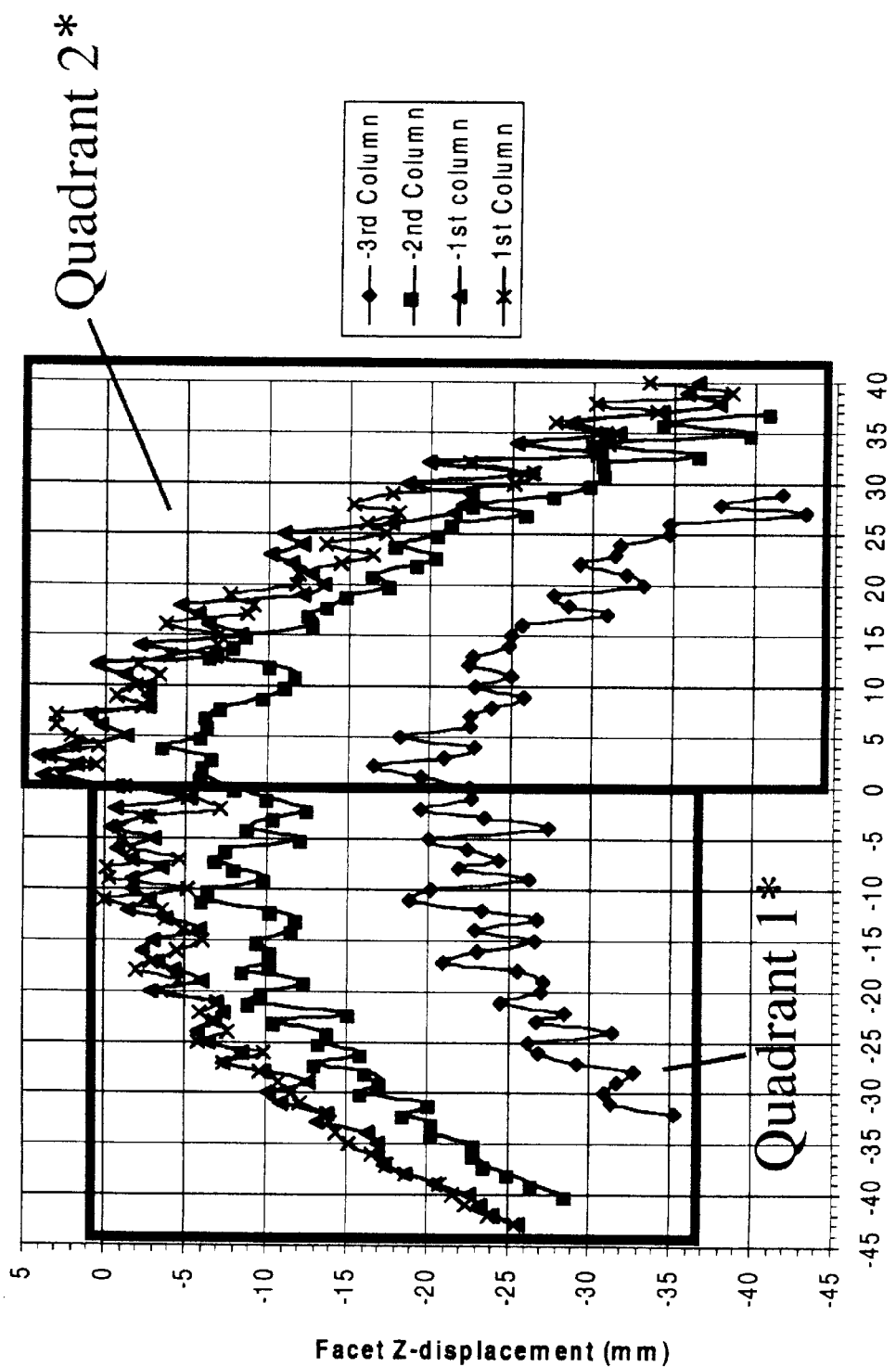
FIG. 9C graphically illustrates the Z displacement of each facet or element in the first reflective fly's eye or mirror array.

FIGS. 9A–C define the position of the facets or elements forming the first reflective fly's eye or mirror array. FIG. 9A represents the alpha tilt angle for the facets in quadrants 1 and 2 of the first reflective fly's eye or mirror array. As can be determined from the graph of FIG. 9A, each row of facets from approximately −45 to +40 has a random linear distribution. The alpha tilt angle ranges from approximately −10.5° to +16°. Additionally, the randomness is approximately 1° for the six columns. While this is presently the preferred embodiment, other similar positions may be utilized depending upon the application and desired illumination field and properties. FIG. 9B graphically illustrates the beta tilt angle for the first reflective fly's eye or mirror array.

As illustrated in FIG. 9B, a random distribution around a nominal value is desired. Accordingly, referring to FIG. 9B, the beta tilt angle for the first reflective fly's eye or mirror array ranges from approximately +0.5° to +11.5° and have a randomness of approximately 1.5°. Similarly, quadrants 3 and 4 have a beta tilt angle that ranges from approximately −11.5° to −0.5°. FIG. 9C graphically represents the displacement in the Z direction for the first reflective fly's eye or mirror array. The Z displacement has a generally random parabolic distribution that ranges from approximately +4 to −44 millimeters, and is concave. Quadrant 2 and correspondingly quadrant 4 have more variation due to larger nominal sag. The outer columns +3 and −3 may have fewer facets.

Figure 10A:
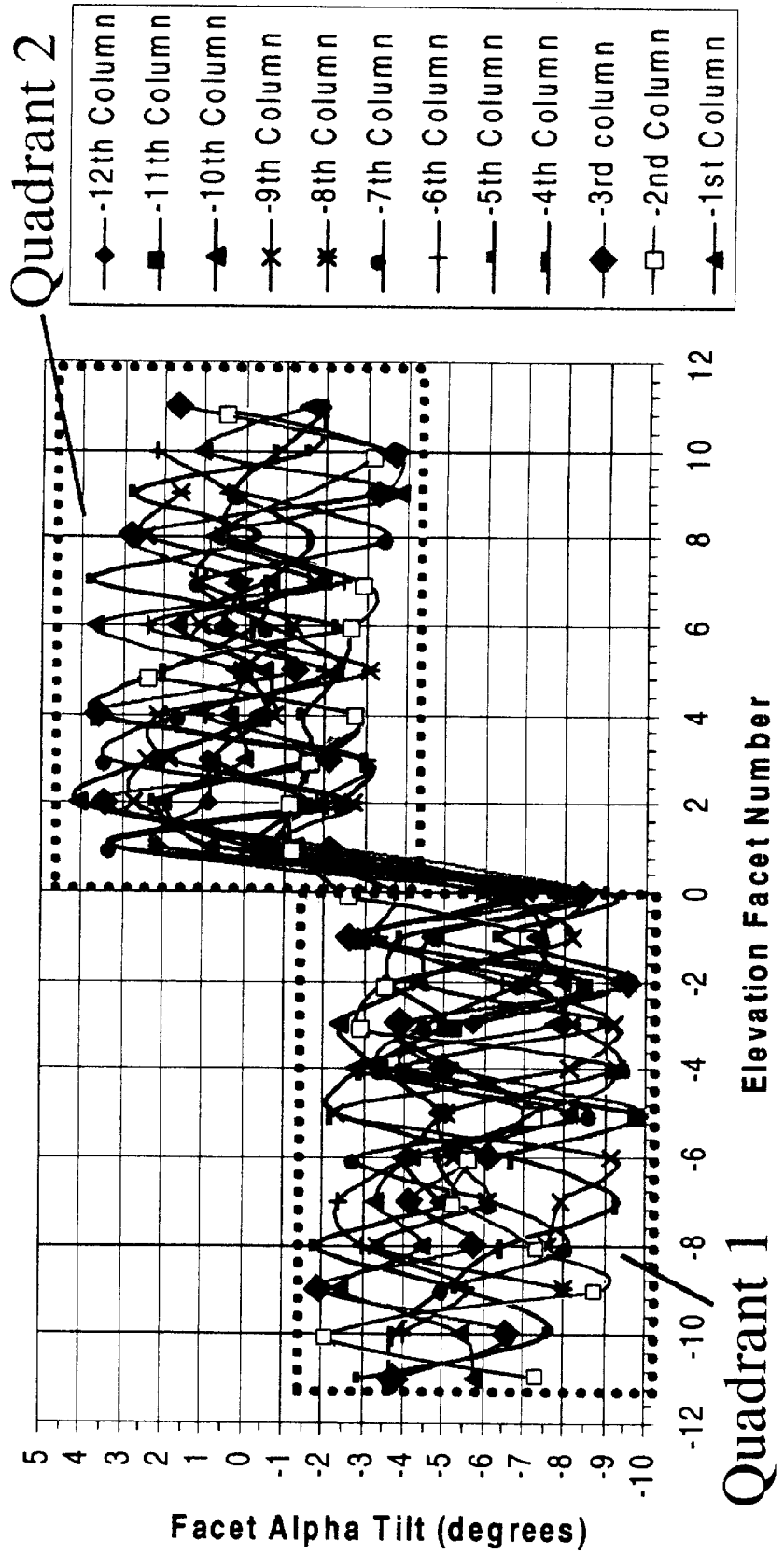
FIG. 10A graphically illustrates the alpha tilt angle of each facet or element in the second reflective fly's eye or mirror array.
Figure 10B:
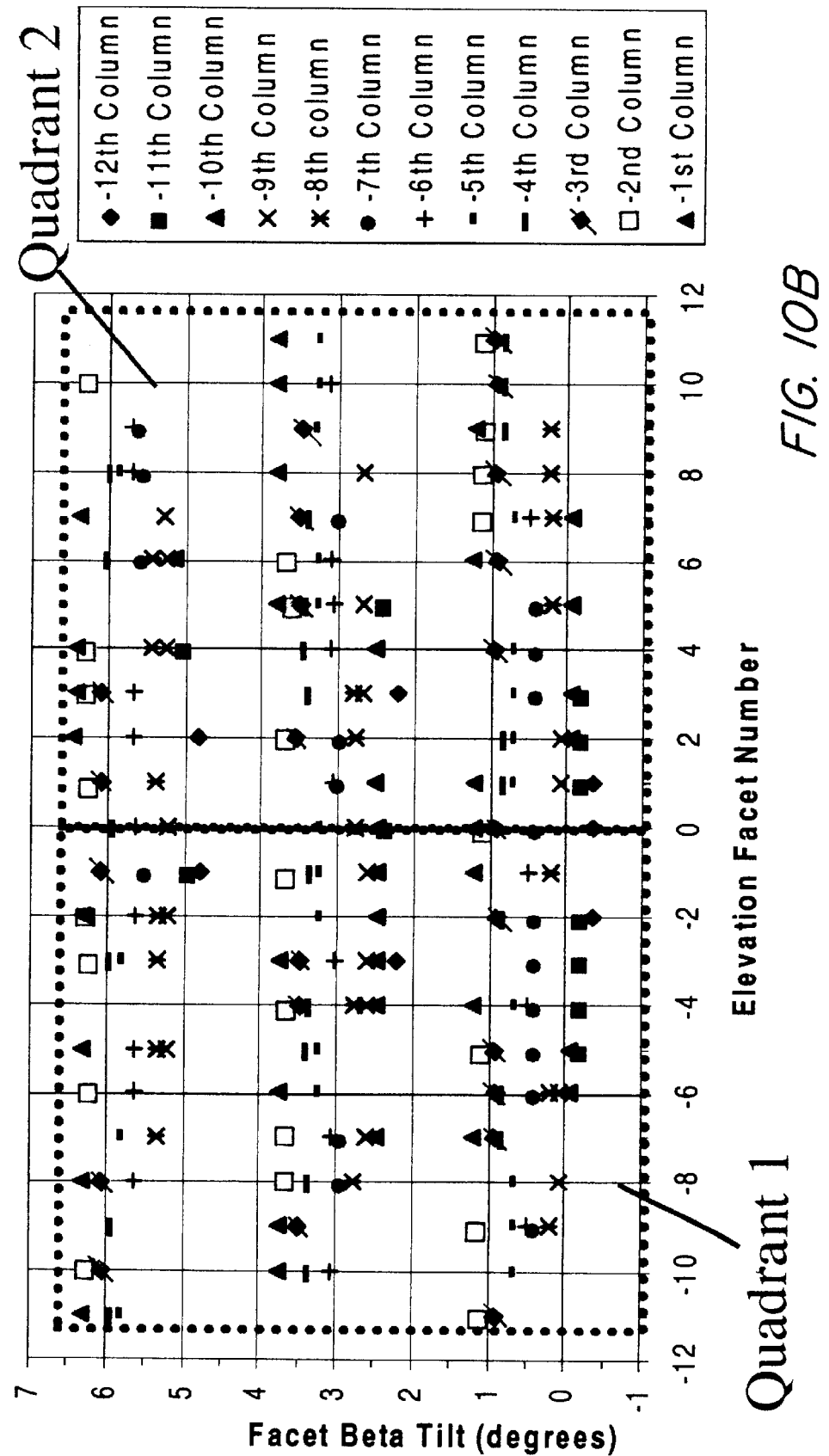
FIG. 10B graphically illustrates the beta tilt angle of each element or facet in the second reflective fly's eye or mirror array.
Figure 10C:
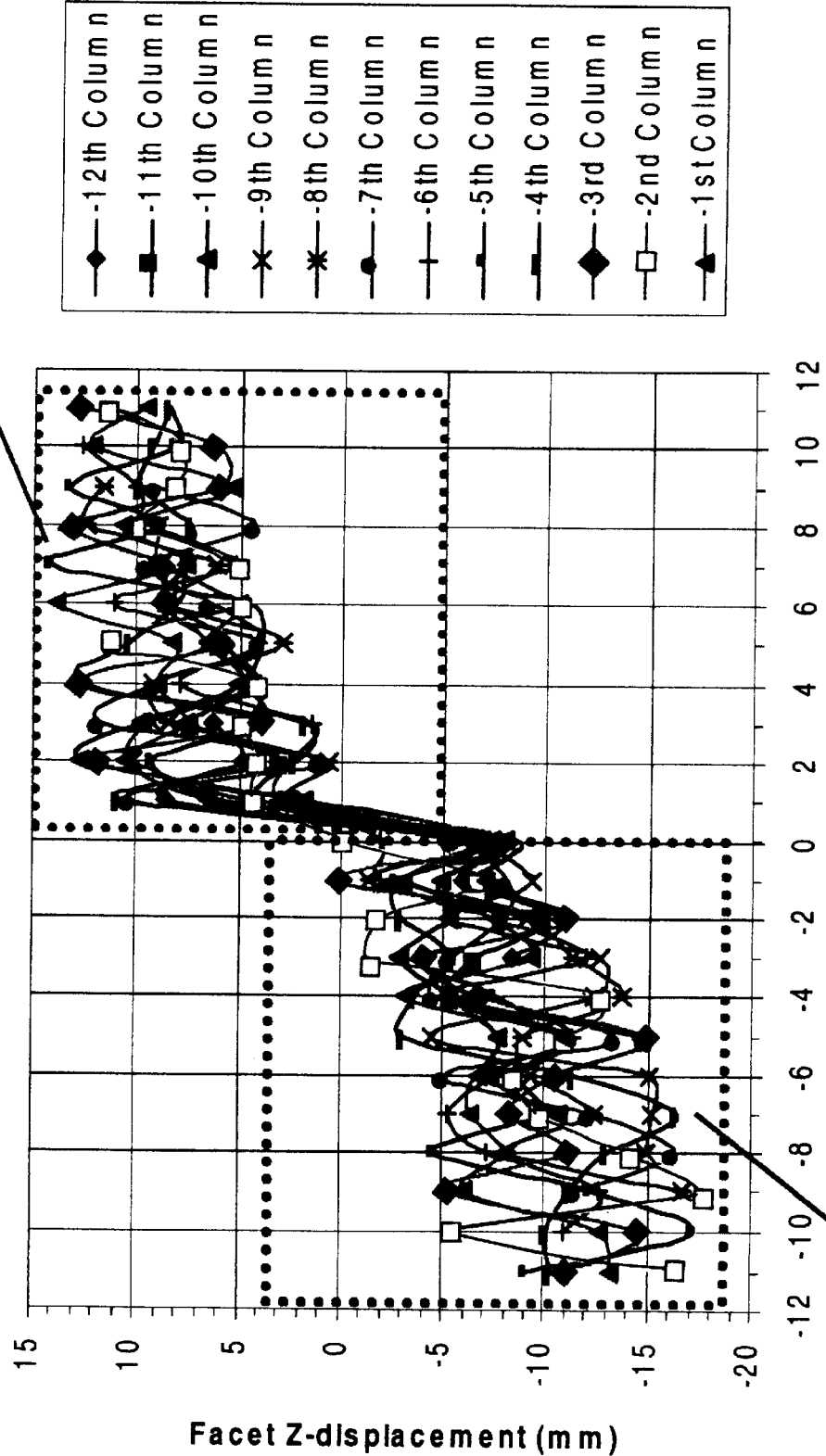
FIG. 10C graphically illustrates the Z displacements of each facet or element in the second reflective fly's eye or mirror array.

FIGS. 10A–C graphically represent the positioning of the facet or elements in the second reflective fly's eye or mirror array. Additionally, from FIGS. 10A–C, it can be appreciated that the number of rows and columns of facets utilized in the second reflective fly's eye or mirror array does not necessarily correspond one to one to the number of facets utilized in the first reflective fly's eye or mirror array. The second reflective fly's eye or mirror array is preferably approximately a twenty-four by twenty-four array. FIG. 10A graphically represents the alpha tilt angle for the second reflective fly's eye or mirror array. As can be seen from FIG. 10A, there is a random linear distribution having a range from approximately −10° to +4° with a randomness of approximately + or −4°. FIG. 10B graphically illustrates the beta tilt angle for the second reflective fly's eye or mirror array. As can be seen from FIG. 10B, there is a random linear distribution having a range from approximately −0.5° to +6.5° with a randomness of approximately + or −3°. Similarly, quadrants 3 and 4 have a beta tilt angle ranging from −6.5° to +0.5°. FIG. 10C graphically represents the Z displacement for the second reflective fly's eye or mirror array. As can be seen from FIG. 10C, there is a random distribution having a range from approximately −23 to +14 millimeters, convex. The twenty-four columns are arranged in a grid pattern. A large step at facet 0 is due to the randomizing by quadrant. An elevation facet near 0 in quadrant 1 of the second reflective fly's eye or mirror array is randomly paired with a facet of the first reflective fly's eye or mirror array, which necessitates a negative displacement, while a similar facet in quadrant 2 is paired with a facet in the first reflective fly's eye or mirror array requiring a positive displacement. This creates the large step near the center of the second reflective fly's eye or mirror array.

It should be appreciated that the positioning of the facets or elements in the first and second reflective fly's eyes or mirror arrays illustrated in FIGS. 9A–C and 10A–C are presently a preferred embodiment. It should be appreciated that the facet or elements positioning clearly may be modified, depending upon the particular application and the desired irradiance and radiant intensity desired or required. Such modifications to the positioning are readily apparent without any undue experimentation to those having ordinary skill in the art, in view of the disclosure of the present invention and the particular application.

Figure 11A:
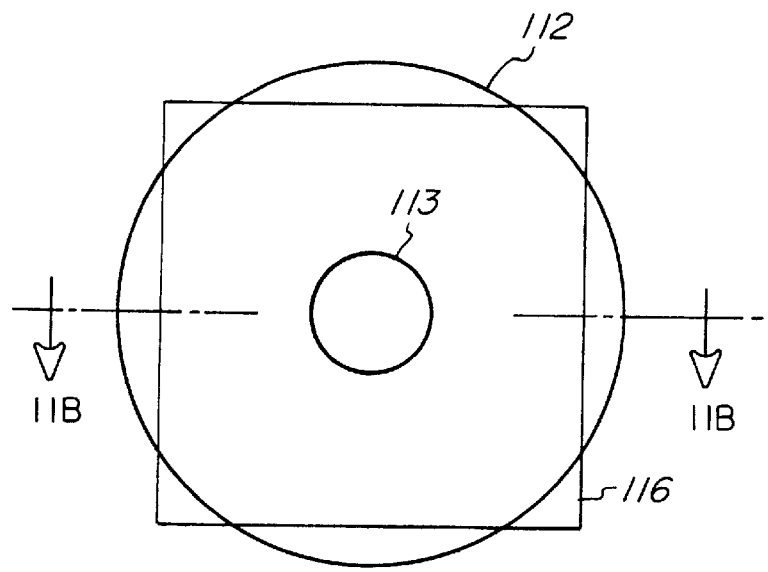
FIG. 11A is a schematic plan view illustrating irradiance from a source received on a first fly's eye or mirror array.
Figure 11B:
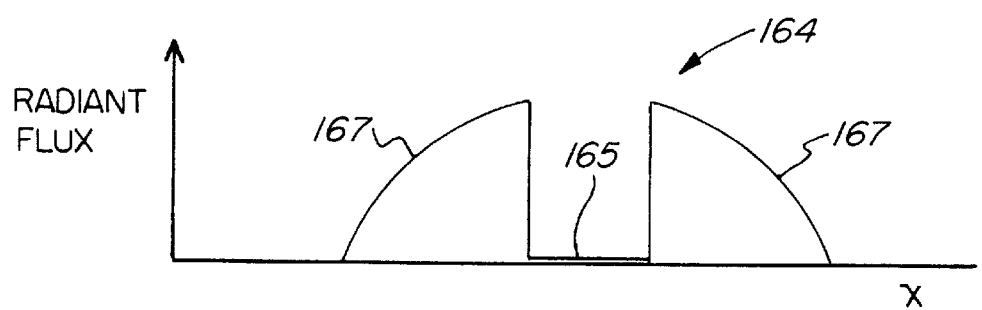
FIG. 11B is a graph depicting the radiant flux resulting along line 11B—11B in FIG. 11A.

Additionally, the term random or randomization is not meant to mean completely random, but arranged randomly or randomized in a predetermined way to achieve a desired result. This may be more fully appreciated with reference to FIGS. 11A–B. FIG. 11A illustrates an illumination pattern 112 from a source received by the first reflective fly's eye or mirror array 116. The illumination pattern, in an embodiment, may have a central obscuration 113. The irradiance of the illumination pattern 112 also is generally not uniform. FIG. 11B is a graph illustrating the radiant flux taken along line 11B—11B in FIG. 1. Waveform 164 illustrates the magnitude of the radiant flux as a function of distance or diameter. Segment 165 represents the central obscuration and curved lines 167 represent the significant drop in energy moving from the facets or mirrors near the central obscuration to the facets or mirrors at the edge of the mirror due to the drop in extreme UV reflectance at the collector mirror. If a one-to-one correlation of facets or mirrors from the first reflective fly's eye or mirror array to the second reflective fly's eye or mirror array is maintained, the source images on the facets or mirrors at the edge of the second reflective fly's eye or mirror array will have significantly less energy than those images near the center. Therefore, the illumination pattern at the second fly's eye or mirror array will not approach the ideal distribution illustrated in FIG. 5B, but will instead resemble FIG. 11B. To compensate for this effect, the correlation between the first reflective fly's eye or mirror array and the second reflective fly's eye or mirror array is selected, engineered, or positioned to redistribute the source images, and therefore the energy, across the second reflective fly's eye or mirror array to obtain a desired result. By correlating a specific facet of the first reflective fly's eye or mirror array with a randomly selected facet of the second reflective fly's eye or mirror array, the average distribution across the second reflective fly's eye or mirror array will more closely approximate the ideal distribution illustrated in FIG. 5B in a preferred embodiment.

To correlate a specific facet of the first reflective fly's eye or mirror array with a facet of the second reflective fly's eye or mirror array the axial location and/or curvature and tilt of the facet is adjusted to produce an image of the source near the desired facet of the second reflective fly's eye or mirror array. The axial position and/or curvature and tilt of the facet on the second reflective fly's eye or mirror array is calculated to ensure the image of the facets of the first reflective fly's eye or mirror array are in focus and overlapped at the reticle plane or illumination field. Note that this method can be used to eliminate or map out the central obscuration from the source that is inherent in a preferred embodiment. By not correlating the facets of the first reflective fly's eye or mirror array that receive insignificant energy from the source, such as those within the obscuration, with a facet of the second reflective fly's eye or mirror array, the central hole in the irradiance pattern on the second reflective fly's eye or mirror array can be eliminated and a more uniform pupil fill produced.

If the curvature of all of the facets of the first reflective fly's eye or mirror array are chosen to be identical, the axial position, or piston, of each facet must be selected to ensure an adequate focus of the source at the selected facet of the second reflective fly's eye or mirror array. When selecting a random correlation, as chosen for the preferred embodiment, this may require large facet-to-facet axial position changes on the first reflective fly's eye or mirror array. These large motions can be minimized by only allowing facets in a specific quadrant of the first reflective fly's eye or mirror array to be correlated with facets in the same quadrant of the second reflective fly's eye or mirror array. This constraint maintains the desired uniform distribution while minimizing the axial facet-to-facet positioning on the first reflective fly's eye or mirror array. The facet-to-facet axial position changes can be eliminated entirely by allowing the curvature, or optical power, of each facet to be adjusted to ensure an adequate focus at the second reflective fly's eye or mirror array. Varying the optical power of each facet of the first reflective fly's eye or mirror array does alter the magnification and size of the source images at the second reflective fly's eye or mirror array, however. Therefore, a proper balance of axial positioning and optical power selection can be chosen to more closely attain the desired pupil fill or radiant intensity. This may similarly be applied to the facets of the second reflective fly's eye or mirror array. For embodiments that opt for identical curvatures on the facets of the second reflective fly's eye or mirror array, the axial location of each facet must be selected to ensure proper focus of the facets of the first reflective fly's eye or mirror array at the reticle plane. The facet-to-facet axial position changes can be minimized by restricting correlation to a specific quadrant and can be eliminated by allowing each facet to have a different curvature, or optical power.

For source images that do not completely fill a particluar facet of the second reflective fly's eye or mirror array, the pupil fill or radiant intensity can be further manipulated by allowing the tilt of the corresponding facet of the first reflective fly's eye or mirror array to be adjusted so that the source image is located anywhere on the selected facet of the second reflective fly's eye or mirror array. The tilt of the facet of the second reflective fly's eye or mirror array must then be adjusted to ensure overlap of the arcuate image at the reticle plane or illumination field. Therefore, any desired pupil fill or radiant intensity can be obtained, in practicing the present invention, by manipulating the number of facets, facet-to-facet correlation, and the size, shape and location of the facets of the second reflective fly's eye or mirror array.

Accordingly, it should readily be appreciated that the present invention permits adjusting the uniformity by varying the number of facets and/or adjusting the size of the illumination region on the first reflective fly's eye or mirror array. The present invention also permits modification of the pupil fill or radiant intensity by varying the number of facets, varying the correlation between facets of the first and second reflective fly's eye or mirror array, by varying the size, shape, and location of the facets of the second reflective fly's eye or mirror array, and/or by varying the position of the source images on the facets of the second reflective fly's eye or mirror array by adding proper tilt to the facets of the first reflective fly's eye or mirror array and adjusting the tilt of the facets of the second reflective fly's eye or mirror array accordingly, for source images smaller than the facets of the second reflective fly's eye or mirror array only.

Additionally, the focus of source images at the second reflective fly's eye or mirror array can be maintained by varying the axial position of corresponding facets of the first reflective fly's eye or mirror array for systems with identical optical power for all facets, varying the optical power of the facets of the first reflective fly's eye or mirror array, and/or selecting a proper combination of axial positioning and optical power of facets of the first reflective fly's eye or mirror array. The focus of the images of the arcuate facets of the first reflective fly's eye or mirror array at the reticle by the facets of the second reflective fly's eye or mirror array can be maintained by, varying axial position of the facets of the second reflective fly's eye or mirror array for systems with identical optical power for all facets, varying the optical power of the facets of the second reflective fly's eye or mirror array, and/or selecting a proper combination of axial positioning and optical power of the facets of the second reflective fly's eye or mirror array. Additionally, undesirable obscurations may be eliminated by not correlating facets of the first reflective fly's eye or mirror array with insignificant energy to a corresponding facet of the second reflective fly's eye or mirror array.

The present invention greatly advances photolithography, especially photolithography using electromagnetic radiation in the extreme ultraviolet wavelength region, or for wavelength ranges generally from 1 nanometer to 157 nanometers. The present invention provides an illumination system when combined with an appropriate projection optic that can image feature sizes as small as 0.025 microns. Additionally, the present invention permits a desired irradiance having a desired angular distribution or radiant intensity to be used in projecting the image of a reticle onto a photosensitive substrate. Accordingly, the present invention provides a desired radiant intensity or angular distribution with high efficiency in a compact package.

The term pupil fill as used to indicate radiant intensity should not be confused with the irradiance distribution at the pupil which is sometimes called pupil fill. It is important to realize that the radiant intensity looking back from the mask to the pupil from each field point, will not necessarily be the same as the irradiance distribution in the pupil. An example would be if the irradiance distribution were uniform, but the right half of the mask or reticle had a radiant intensity which was the right half of a circle and the left half of the mask or reticle had a radiant intensity which was the left half of a circle.

While the present invention has been illustrated and described with respect to the preferred embodiments, it should be appreciated that modifications may be made without departing from the spirit and scope of the present invention.

What is claimed is:

1. An illumination system for forming a shaped illumination field comprising:
   a source of electromagnetic radiation;
   a first faceted mirror receiving the electromagnetic radiation from said source; and
   a second faceted mirror receiving the electromagnetic radiation reflected from said first faceted mirror, said second faceted mirror having facets with a plurality of different tilts wherein electromagnetic radiation is redistributed providing a substantially uniform irradiance in the shaped illumination field,
   whereby a predetermined illumination field is formed.

2. An illumination system as in claim 1 further comprising:
   a reflector positioned to collect and reflect the electromagnetic radiation from said source and direct the electromagnetic radiation towards said first faceted mirror.

3. An illumination system as in claim 1 further comprising:
   a relay positioned to receive the electromagnetic radiation from the second faceted mirrors.

4. An illumination system as in claim 1 wherein:
   said first faceted mirror forms a plurality of images of said source on said second faceted mirror and said second faceted mirror redirects the electromagnetic radiation to form an illumination field having a predetermined shape with a desired radiant intensity.

5. An illumination system as in claim 1 wherein:
   said first and second faceted mirrors comprise a plurality of concave mirror surfaces.

6. An illumination system as in claim 5 wherein:
   each of the plurality of concave mirrors of said first faceted mirror has an arcuate shape.

7. An illumination system as in claim 5 wherein:
   each of the plurality of concave mirrors of said second faceted mirror has a rectangular shape.

8. An illumination system as in claim 5 wherein:
   a desired irradiance distribution is provided.

9. An illumination system as in claim 5 wherein:
   said plurality of concave mirrors have different optical power.

10. An illumination system as in claim 1 wherein:
    the electromagnetic radiation has a wavelength in the extreme ultraviolet.

11. An illumination system as in claim 1 wherein:
    said first faceted mirror comprises at least a three by ten mirror array; and
    said second faceted mirror comprises at least a six by six mirror array.

12. An illumination system comprising:
    a source of electromagnetic radiation;
    a first faceted mirror receiving the electromagnetic radiation from said source; and
    a second faceted mirror receiving the electromagnetic radiation reflected from said first faceted mirror,
    said first and second faceted mirrors comprise a plurality of concave mirror surfaces, and
    said plurality of concave mirrors of said first faceted mirror form a generally concave shape,
    whereby a predetermined illumination field is formed.

13. An illumination system comprising:
    a source of electromagnetic radiation;
    a first faceted mirror receiving the electromagnetic radiation from said source; and
    a second faceted mirror receiving the electromagnetic radiation reflected from said first faceted mirror,
    said first and second faceted mirrors comprise a plurality of concave mirror surfaces, and
    said plurality of concave mirrors of said second faceted mirror form a generally convex shape,
    whereby a predetermined illumination field is formed.

14. An illumination system comprising:
    a source of electromagnetic radiation;
    a first faceted mirror receiving the electromagnetic radiation from said source; and
    a second faceted mirror receiving the electromagnetic radiation reflected from said first faceted mirror,
    said first and second faceted mirrors comprise a plurality of concave mirror surfaces, and
    said plurality of concave mirrors have a tilt arrangement, whereby energy is distributed as desired,
    whereby a predetermined illumination field is formed.

15. An illumination system comprising:
    a source of extreme ultraviolet electromagnetic radiation;
    first reflective fly's eye means, positioned to receive electromagnetic radiation from said source, for forming multiple images of said source; and
    second reflective fly's eye means, positioned to receive electromagnetic radiation reflected and imaged by said first reflective fly's eye means, for overlapping and redistributing the multiple images of the source received from said first reflective fly's eye means and forming an illumination field having a predetermined radiant intensity and predetermined shape.

16. An illumination system as in claim 15 further comprising:

reflector means, positioned to receive the electromagnetic radiation from said source, for collecting the electromagnetic radiation from said source and reflecting the electromagnetic radiation towards said first reflective fly's eye means.

17. An illumination system as in claim 15 further comprising:

a relay positioned to receive electromagnetic radiation reflected from said second fly's eye means.

18. An illumination system as in claim 15 wherein:

said first reflective fly's eye means comprises a first mirror array comprising a plurality of concave mirrors; and said second reflective fly's eye means comprises a second mirror array comprising a plurality of concave mirrors.

19. An illumination system as in claim 18 wherein:

a desired irradiance distribution is provided.

20. An illumination system as in claim 18 wherein:

the plurality of concave mirrors in said first and second mirror arrays have different optical power, whereby focus is maintained at the second mirror array and the illumination field.

21. An illumination system comprising:

a source of extreme ultraviolet electromagnetic radiation;

first reflective fly's eye means, positioned to receive electromagnetic radiation from said source, for forming multiple images of said source, said first reflective fly's eye means comprises an overall generally concave surface; and second reflective fly's eye means, positioned to receive electromagnetic radiation reflected and imaged by said first reflective fly's eye means, for overlapping the multiple images of the source received from said first reflective fly's eye means and forming an illumination field having a predetermined radiant intensity and predetermined shape, said second reflective fly's eye means comprises an overall generally convex surface.

22. An illumination system as in claim 21 wherein:

the overall generally concave surface is parabolic.

23. An illumination system comprising:

a source of extreme ultraviolet electromagnetic radiation;

first reflective fly's eye means, positioned to receive electromagnetic radiation from said source, for forming multiple images of said source, said first reflective fly's eye means comprises a first mirror array comprising a plurality of concave mirrors, each of the plurality of concave mirrors of said first mirror array are tilted; and second reflective fly's eye means, positioned to receive electromagnetic radiation reflected and imaged by said first reflective fly's eye means, for overlapping the multiple images of the source received from said first reflective fly's eye means and forming an illumination field having a predetermined radiant intensity and predetermined shape, said second reflective fly's eye means comprises a second mirror array comprising a plurality of concave mirrors, each of the plurality of concave mirrors of said second mirror array are tilted to overlap images at the illumination field.

24. An illumination system comprising:

a source of extreme ultraviolet electromagnetic radiation;

a reflector reflecting the electromagnetic radiation;

a first base, said first base having a first shaped surface;

a first reflective fly's eye having a first plurality of arcuate facets formed on the first shaped surface and positioned to receive and reflect the electromagnetic radiation;

a second base, said second base having a second shaped surface; and a second reflective fly's eye having a second plurality of facets formed on the second shaped surface and positioned to receive and reflect the electromagnetic radiation, the first plurality of facets positioned so as to image said source at the second plurality of facets, the second plurality of facets positioned to form an arcuate illumination field having a desired irradiance and radiant intensity.

25. An illumination system as in claim 24 wherein:

the first plurality of arcuate facets are randomly tilted, so as to distribute energy on the second plurality of facets.

26. An illumination system as in claim 24 wherein:

the plurality of facets in said first and second reflective fly's eyes have different optical power, whereby focus is maintained and changes in said first and second base surfaces may be made aiding in manufacturing and alignment.

27. An illumination system as in claim 24 further comprising:

a relay positioned to receive electromagnetic radiation reflected from said second reflective fly's eye.

28. An illumination system comprising:

a source of extreme ultraviolet electromagnetic radiation;

an elliptical reflector reflecting the electromagnetic radiation;

a first base having a concave shaped surface;

a first reflective fly's eye having a first plurality of arcuate concave facets formed on the concave shaped surface, each of the first plurality of arcuate concave facets having a predetermined position and tilt to receive and reflect the electromagnetic radiation;

a second base having a convex shaped surface, said second base positioned to receive the electromagnetic radiation reflected from said first reflective fly's eye; and a second reflective fly's eye having a second plurality of concave facets formed on the convex shaped surface, each of the second plurality of concave facets having a predetermined position and tilt to receive and reflect the electromagnetic radiation, each of the first plurality of facets having a predetermined position and tilt so as image said source on the second plurality of facets, whereby an arcuate illumination field having a desired irradiance and radiant intensity is formed.

29. An illumination system as in claim 28 wherein:

the first plurality of arcuate concave facets each have a tilt ranging between negative 11.5 degrees and positive 16 degrees relative to a reference plane.

30. An illumination system as in claim 28 wherein:

the second plurality of concave facets each have a tilt ranging between negative 10 degrees and positive 10 degrees relative to a reference plane.

31. An illumination system as in claim 28 wherein:

said first reflective fly's eye comprises at least a three by ten mirror array; and said second reflective fly's eye comprises at least a six by six mirror array.

32. An illumination system as in claim 28 wherein:

the mirrors in said first and second reflective fly's eyes have different optical power.

33. An illumination system as in claim 28 further comprising:
a relay positioned to receive electromagnetic radiation reflected from said second reflective fly's eye.

34. A condenser for an illumination system used to project the image of a reticle onto a photosensitive substrate comprising:
first reflective fly's eye means, positioned to receive electromagnetic radiation from a source, for forming multiple images of the source; and
second reflective fly's eye means, positioned to receive electromagnetic radiation reflected and imaged by said first reflective fly's eye means, for overlapping and redistributing the multiple images formed by said first reflective fly's eye means and forming an illumination field having a predetermined radiant intensity and shape.

35. A condenser as in claim 34 further comprising:
reflector means, positioned to receive electromagnetic radiation from the source, for collecting electromagnetic radiation from the source and reflecting electromagnetic radiation to said first reflective fly's eye means.

36. A condenser as in claim 34 further comprising:
a relay positioned to receive electromagnetic radiation reflected from said second reflective fly's eye means.

37. A condenser as in claim 34 wherein:
said first and second reflective fly's eye means each comprises a mirror array.

38. A condenser as in claim 37 wherein:
the mirrors in the mirror arrays have different optical powers.

39. A condenser for an illumination system used to project the image of a reticle onto a photosensitive substrate comprising:
first reflective fly's eye means, positioned to receive electromagnetic radiation from a source, for forming multiple images of the source; and
second reflective fly's eye means, positioned to receive electromagnetic radiation reflected and imaged by said first reflective fly's eye means, for overlapping the multiple images formed by said first reflective fly's eye means and forming an illumination field having a predetermined radiant intensity and shape,
said first and second reflective fly's eye means each comprises a mirror array,
each mirror in the mirror array of the first reflective fly's eye means is randomly tilted within a predetermined range; and
the tilt of the mirrors in the mirror array of the second reflective fly's eye means are used to compensate and form the illumination field.

40. A condenser for an illumination system used to project the image of a reticle onto a photosensitive substrate comprising:
a first reflective fly's eye comprising a first plurality of mirrors forming an array, each of the first plurality of mirrors having a predetermined displacement and angular tilt;
a second reflective fly's eye comprising a second plurality of mirrors forming an array, each of the second plurality of mirrors having a predetermined displacement and angular tilt whereby electromagnetic radiation reflected from the first plurality of mirrors is received by the second plurality of mirrors,
whereby the predetermined displacement and angular tilt of the first and second plurality of mirrors results in forming an illumination field of predetermined shape with a desired radiant intensity.

41. A condenser as in claim 40 further comprising:
a relay positioned to receive electromagnetic radiation reflected from said second reflective fly's eye.

42. A condenser as in claim 40 wherein:
the angular tilt of the first and second plurality of mirrors is random within a predetermined range.

43. A condenser for an illumination system used to project the image of a reticle onto a photosensitive substrate comprising:
a first faceted mirror positioned to receive electromagnetic radiation from a source and form multiple images of the source; and
a second faceted mirror positioned to receive the multiple images of the source formed by said first faceted mirror and to overlap and redistribute the multiple images formed by said first faceted mirror,
whereby an illumination field having a predetermined radiant intensity and shape is formed.

44. A condenser for an illumination system as in claim 43 wherein:
said first faceted mirror comprises arcuate facets.

45. A condenser for an illumination system as in claim 43 wherein:
said first and second faceted mirrors each have a number of facets,
whereby the number of facets are varied to adjust uniformity at the illumination field.

46. A condenser for an illumination system as in claim 43 wherein:
an illumination region received by said first faceted mirror is adjusted in size.

47. A condenser for an illumination system as in claim 43 wherein:
said first and second faceted mirrors each have a number of facets,
whereby the number of facets are varied to modify radiant intensity at the illumination field.

48. A condenser for an illumination system as in claim 47 wherein:
correlation between the number of facets of the first and second faceted mirrors is varied,
whereby radiant intensity may be modified.

49. A condenser for an illumination system as in claim 47 wherein:
the size, shape, and location of the number of facets of the second faceted mirror are varied.

50. A condenser for an illumination system as in claim 47 wherein:
focus of the multiple images received by said second faceted mirror is obtained by varying an axial position of the number of facets of said first faceted mirror.

51. A condenser for an illumination system as in claim 47 wherein:
focus of the multiple images received by said second faceted mirror is obtained by varying an optical power of the number of facets of said first faceted mirror.

52. A condenser for an illumination system as in claim 47 wherein:
focus of the multiple images received by said second faceted mirror is obtained by varying a combination of axial position and optical power of the number of facets of said first faceted mirror.

53. A condenser for an illumination system as in claim 47 wherein:
focus of the multiple images formed at the illumination field is obtained by varying an axial position of the number of facets of said second faceted mirror.

54. A condenser for an illumination system as in claim 47 wherein:
focus of the multiple images formed at the illumination field is obtained by varying an optical power of the number of facets of said second faceted mirror.

55. A condenser for an illumination system as in claim 47 wherein:
focus of the multiple images formed at the illumination field is obtained by varying a combination of axial position and optical power of the number of facets of said second faceted mirror.

56. A condenser for an illumination system as in claim 43 wherein:
undesirable obscuations are eliminated by correlating the number of facets of the first faceted mirror receiving predetermined energy to the second faceted mirror,
whereby insignificant energy in the undesirable obscuration is eliminated.

57. A condenser for an illumination system used to project the image of a reticle onto a photosensitive substrate comprising:
a first faceted mirror positioned to receive electromagnetic radiation from a source and form multiple images of the source; and
a second faceted mirror positioned to receive the multiple images if the source formed by said first faceted mirror and to overlap the multiple images formed by said first faceted mirror,
said first and second faceted mirrors each have a number of facets, whereby the number of facets are varied to modify radiant intensity at an illumination field,
a position of the multiple images of the source formed on the second faceted mirror are varied by tilting each of the number of facets of the first faceted mirror,
whereby the illumination field having a predetermined radiant intensity and shape is formed.

58. An illumination system for forming an illumination field having a predetermined shape comprising:
a source of non-collimated electromagnetic radiation;
a concave base;
a first plurality of mirrors placed on said concave base, each of said plurality of mirrors having the predetermined shape of the illumination field;
a convex base;
a second plurality of mirrors placed on said convex base, each of said second plurality of mirrors having a different tilt angle, whereby the electromagnetic radiation is redistributed over the predetermined shape of the illumination field; and
a relay positioned to image an aperture stop adjacent said second plurality of mirrors into a pupil of a projection optic;
whereby the illumination field of the predetermined shape is instantaneously formed having a substantially uniform irradiance.

* * * * *